(12) United States Patent
Cheng et al.

(10) Patent No.: US 10,170,479 B2
(45) Date of Patent: Jan. 1, 2019

(54) FABRICATION OF VERTICAL DOPED FINS FOR COMPLEMENTARY METAL OXIDE SEMICONDUCTOR FIELD EFFECT TRANSISTORS

(71) Applicant: INTERNATIONAL BUSINESS MACHINES CORPORATION, Armonk, NY (US)

(72) Inventors: Kangguo Cheng, Schenectady, NY (US); Zuoguang Liu, Schenectady, NY (US); Sanjay C. Mehta, Niskayuna, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/606,736

(22) Filed: May 26, 2017

(65) Prior Publication Data

US 2018/0006037 A1    Jan. 4, 2018

Related U.S. Application Data

(62) Division of application No. 15/199,544, filed on Jun. 30, 2016, now Pat. No. 9,871,041.

(51) Int. Cl.
*H01L 27/092* (2006.01)
*H01L 29/06* (2006.01)
(Continued)

(52) U.S. Cl.
CPC ........ *H01L 27/0924* (2013.01); *H01L 21/265* (2013.01); *H01L 21/324* (2013.01); *H01L 21/823821* (2013.01); *H01L 21/823878* (2013.01); *H01L 29/0642* (2013.01); *H01L 29/0646* (2013.01); *H01L 29/36* (2013.01);
(Continued)

(58) Field of Classification Search
None
See application file for complete search history.

(56) References Cited

U.S. PATENT DOCUMENTS 8,314,463 B2    11/2012    Cai et al.
8,497,171 B1    7/2013    Wu et al.
(Continued)

OTHER PUBLICATIONS

List of IBM Patents or Patent Applications Treated as Related dated May 26, 2017, 2 pages.

*Primary Examiner* — Daniel Whalen
(74) *Attorney, Agent, or Firm* — Tutunjian & Bitetto; Vazken Alexanian (57) ABSTRACT

A method of forming a fin field effect transistor (finFET) with a doped substrate region, including forming a plurality of vertical fins on a substrate, forming a first dopant source on one or more of the plurality of vertical fins, wherein the first dopant source is not formed on at least one vertical fin, forming a second dopant source on the at least one vertical fin that does not have a first dopant source formed thereon, and heat treating the plurality of vertical fins on the substrate, the first dopant source, and the second dopant source, wherein the heat treatment is sufficient to cause a first dopant from the first dopant source to diffuse into at least a first portion of the substrate, and a second dopant from the second dopant source to diffuse into at least a second portion of the substrate.

16 Claims, 9 Drawing Sheets

(51) Int. Cl.
*H01L 29/78* (2006.01)
*H01L 21/8238* (2006.01)
*H01L 29/66* (2006.01)
*H01L 21/265* (2006.01)
*H01L 21/324* (2006.01)
*H01L 29/36* (2006.01)

(52) U.S. Cl.
CPC ...... *H01L 29/66795* (2013.01); *H01L 29/785* (2013.01)

(56) References Cited

U.S. PATENT DOCUMENTS

| | | |
|---|---|---|
| 8,610,201 B1 | 12/2013 | Hokazono |
| 8,673,718 B2 | 3/2014 | Maszara et al. |
| 8,809,872 B2 | 8/2014 | Cai et al. |
| 8,853,008 B1 | 10/2014 | Lee |
| 8,883,597 B2 | 11/2014 | Chang et al. |
| 9,023,715 B2 | 5/2015 | Faul et al. |
| 2015/0179503 A1 | 6/2015 | Tsai et al. |
| 2016/0027644 A1 | 1/2016 | Tsai et al. |
| 2016/0343623 A1* | 11/2016 | Fogel ............... H01L 21/823878 |
| 2017/0062427 A1* | 3/2017 | Basker ............ H01L 21/823821 |

\* cited by examiner

FABRICATION OF VERTICAL DOPED FINS FOR COMPLEMENTARY METAL OXIDE SEMICONDUCTOR FIELD EFFECT TRANSISTORS

BACKGROUND

Technical Field

The present invention generally relates to the fabrication of vertical fins with dual doped fins, and more particularly to the fabrication of complementary metal oxide semiconductor (CMOS) field effect transistors including a plurality of doped vertical fins separated by isolation regions.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a gate on the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a fin field effect transistor (finFET) with a doped substrate region. The method includes the step of forming a plurality of vertical fins on a substrate, forming a first dopant source on one or more of the plurality of vertical fins, wherein the first dopant source is not formed on at least one vertical fin. The method further includes the step of forming a second dopant source on the at least one vertical fin that does not have a first dopant source formed thereon. The method further includes the step of heat treating the plurality of vertical fins on the substrate, the first dopant source, and the second dopant source, wherein the heat treatment is sufficient to cause a first dopant from the first dopant source to diffuse into at least a first portion of the substrate, and a second dopant from the second dopant source to diffuse into at least a second portion of the substrate.

In accordance with an embodiment of the present principles, a method is provided for forming a fin field effect transistor (finFET) with a doped substrate region. The method includes the step of forming a plurality of vertical fins on a substrate by a sidewall image transfer process, where a first region of the substrate includes one or more vertical fin(s), and a second region on the substrate adjacent to the first region includes one or more vertical fin(s). The method further includes the steps of forming a first dopant source on the one or more vertical fin(s) in the first region, and forming a second dopant source on the one or more fin(s) in the second region, where the second dopant source is adjacent to and in contact with the first dopant source. The method further includes the step of heat treating the plurality of vertical fins on the substrate, the first dopant source, and the second dopant source, wherein the heat treatment is sufficient to cause a first dopant from the first dopant source to diffuse into at least a first portion of the substrate, and a second dopant from the second dopant source to diffuse into at least a second portion of the substrate.

In accordance with another embodiment of the present principles, complementary metal oxide semiconductor (CMOS) device with punch-through stops/wells is provided. The device includes one or more vertical fin(s) on the substrate in a first region and one or more vertical fin(s) on the substrate in a second region, where the first region is adjacent to the second region, and the one or more vertical fin(s) in the first region are doped to form an n-type field effect transistor and the one or more vertical fin(s) in the second region are doped to form a p-type field effect transistor. The device further includes a first dopant source on the one or more vertical fin(s) in the first region, and a second dopant source on the one or more vertical fin(s) in the second region. The device further includes a first doped region in the substrate forming a first punch-through stop/well below the first dopant source, and a second doped region in the substrate forming a second punch-through stop/well below the second dopant source.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Principles and embodiments of the present disclosure relate generally to the formation of doped vertical fins and a punch-through stop/well region in the substrate for a complementary metal oxide semiconductor (CMOS) device. After forming a plurality of vertical fins arranged to form the CMOS device(s), the vertical fins and substrate underlying the vertical fins may be suitably doped to form the complementary n-doped and p-doped field effect transistors (NFET and PFET). The CMOS device(s) can include a symmetrical pair of p-type (PFET) and n-type (NFET) metal oxide semiconductor field effect transistors (MOSFETs) or fin-FETs.

Principles and embodiments of the present disclosure relate generally to utilizing a doped insulating layer as both an isolation region and as the source of dopant to form the intended NFET and PFET devices by forming two separate dopant-rich insulating layers on the substrate and respective vertical fins intended to be impregnated with the selected (n-type or p-type) dopant. Portions of the substrate and vertical fins may be doped by heat treating a dopant-rich layer formed around the vertical fins containing a concentration of suitable dopant atoms, where the dopant may diffuse into portions of the substrate and vertical fins. The dopant diffused into the substrate may form a counter-doped punch-through stop/well region below the vertical fins to reduce or prevent source/drain punch-through. Punch-through is typically a case of channel length modulation where the depletion layers around the drain and source regions merge into a single depletion region to create an alternate current path not controlled by the device gate. The current path is typically located deeper into the substrate and farther away from the gate. The uncontrolled current path can add to the subthreshold leakage current, which can lead to increased power consumption. Punch-through can depend on the applied drain voltage and on the source/drain junction depths. The drain and source depletion regions may be reduced by decreasing the source/drain junction depths, and/or counter-doping the intervening substrate region to form a punch-through stop, to mitigate the parasitic current path.

In one or more embodiments, a layer of material including an n-type dopant may be formed on a first region of the substrate including one or more vertical fins, and a layer of material including a p-type dopant may be formed on a second region of the substrate adjacent to the first region, where the second region includes one or more vertical fins. The n-type dopant may diffuse into the one or more vertical fins and substrate below the one or more vertical fins in the first region, and the p-type dopant may diffuse into the one or more vertical fins and substrate below the one or more vertical fins in the second region during an annealing process, where the first region and second region may overlap to form a compensated interface. The layer of material including the dopant may be an amorphous silicon oxide (i.e., a glass) impregnated with the dopant species.

Exemplary applications/uses to which the present principles can be applied include, but are not limited to: formation of finFETs, complementary metal oxide silicon (CMOS) field effect transistors (FETs) formed by coupled finFETs, and digital gate and memory devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention. It should be noted that certain features may not be shown in all figures for the sake of clarity. This is not intended to be interpreted as a limitation of any particular embodiment, or illustration, or scope of the claims.

Figure 1:
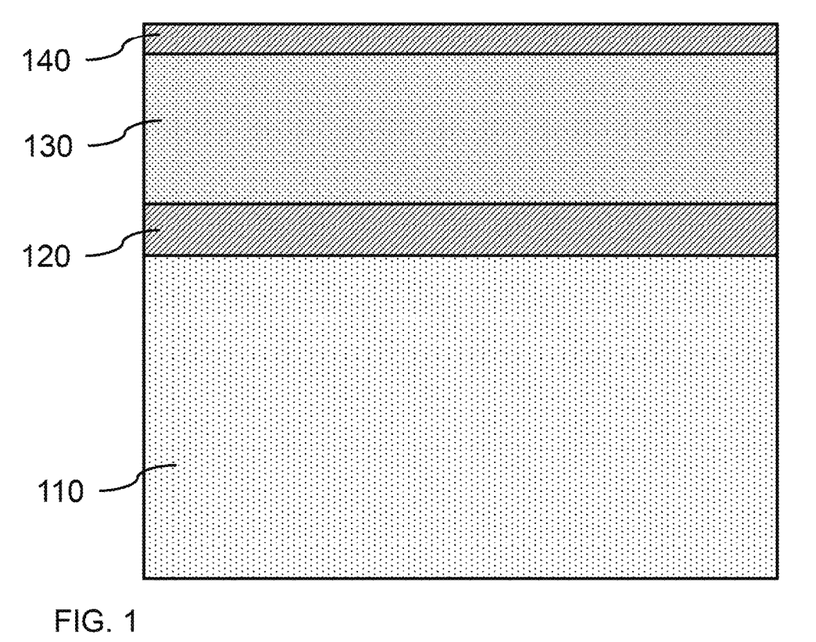
FIG. 1 is a cross-sectional side view of a masking layer, a mandrel layer, and a hardmask layer on a substrate, in accordance with an embodiment of the present principles.

Referring now to the drawings in which like numerals represent the same or similar elements and initially to FIG. 1, which is a cross-sectional side view of a masking layer, a mandrel layer, and a hardmask layer on a substrate, in accordance with an embodiment of the present principles.

In one or more embodiments, a substrate 110 may be a single crystal semiconductor. The substrate may be essentially (i.e., except for contaminants) a single element (e.g., silicon), primarily (i.e., with doping) of a single element, for example, silicon (Si).

In one or more embodiments, a hardmask layer 120 may be formed on at least a portion of a substrate 110. A hardmask layer 120 may be formed on an exposed surface of the substrate 110 by a blanket deposition.

In various embodiments, the hardmask layer 120 may be an oxide, for example, silicon oxide (SiO), a nitride, for example, a silicon nitride (SiN), or an oxynitride, for example, silicon oxynitride (SiON), or combinations thereof. In various embodiments, the hardmask layer 120 may be silicon nitride (SiN), for example, $Si_3N_4$. The hard mask layer may be formed by a thermal process, such as, for example, oxidation or nitridation of the top semiconductor (e.g., Si) layer of the substrate 110. A combination of the various processes (e.g., CVD, PVD, etc.) may also be used to form hardmask layer 120.

In one or more embodiments, the hardmask layer 120 may have a thickness in the range of about 20 nm to about 100 nm, or in the range of about 35 nm to about 75 nm, or in the range of about 45 nm to about 55 nm, although other thicknesses are contemplated.

In one or more embodiments, a mandrel layer 130 may be formed on at least a portion of the surface of the hardmask layer 120. The mandrel layer 130 may be blanket deposited on the hardmask layer 120, where the mandrel layer 130 may be, for example, an amorphous silicon (a-Si) layer, a silicon oxide (SiO) layer, a silicon nitride (SiN) layer, a silicon oxynitride (SiON), or a combination thereof.

In one or more embodiments, the mandrel layer 130 may be formed by a CVD process.

A masking layer 140 may be formed on the exposed surface of the mandrel layer 130. The masking layer 140 may be a temporary resist (e.g., poly methyl methacrylate (PMMA)) that may be deposited on the mandrel layer 130, patterned, and developed to expose portions of the mandrel layer 130. The masking layer 140 may be a positive resist or a negative resist that may be formed and patterned on the surface of the mandrel layer 130 to form masking sections 141 exposing portions of the mandrel layer.

Figure 2:
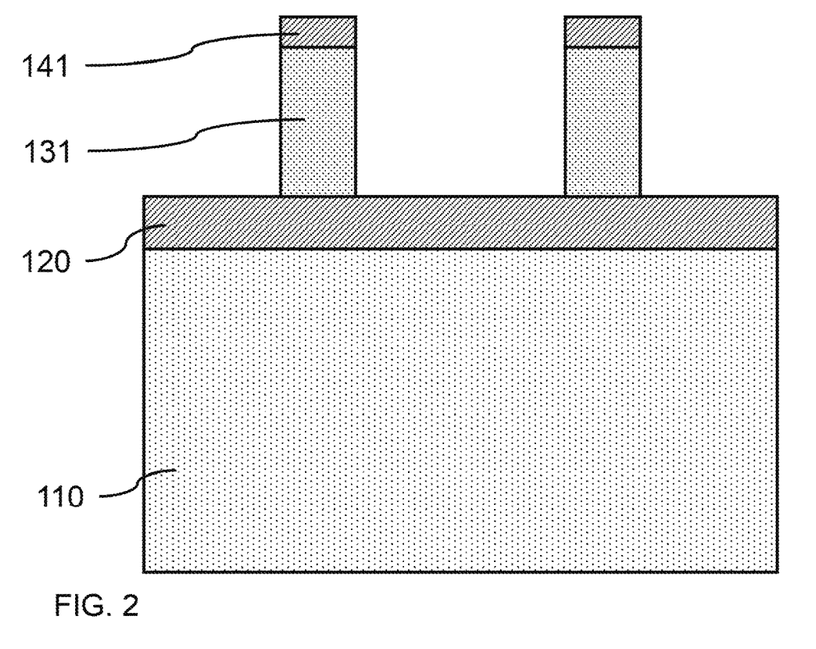
FIG. 2 is a cross-sectional side view of sacrificial mandrels formed on the hardmask and substrate, in accordance with an embodiment of the present principles.

FIG. 2 is a cross-sectional side view of sacrificial mandrels formed on the hardmask and substrate, in accordance with an embodiment of the present principles.

In one or more embodiments, portions of the mandrel layer 130 may be removed to form one or more sacrificial mandrel(s) 131, where the masking sections 141 defines the width, length, and location of the sacrificial mandrel(s) 131 on the hardmask layer 120. Portions of the mandrel layer 130 may be removed by a directional, dry plasma etch (e.g., reactive ion etch (RIE)). In various embodiments, the hardmask layer 120 may act as an etch stop.

Figure 3:
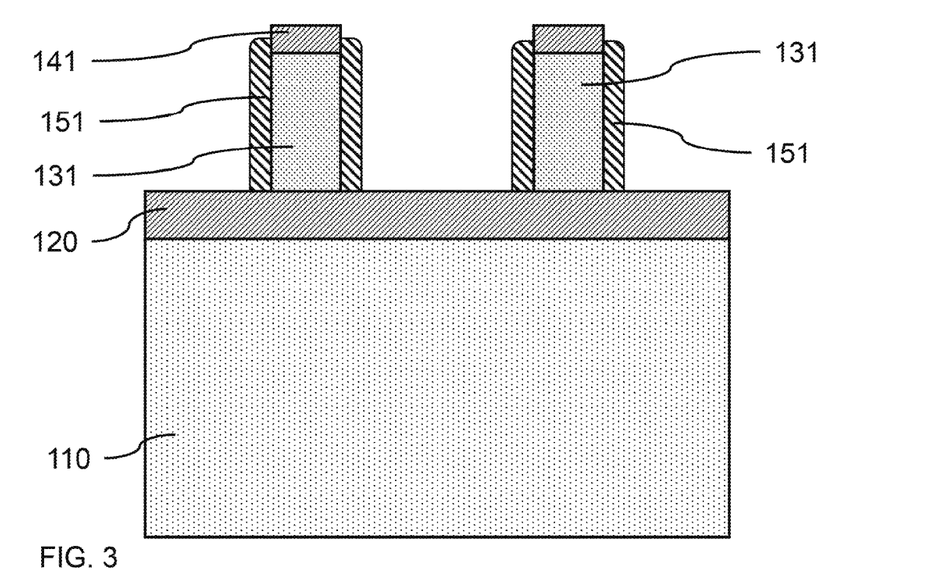
FIG. 3 is a cross-sectional side view of a substrate with a hardmask layer, two sacrificial mandrels, and two upright spacers and a photo mask layer on each mandrel, in accordance with an embodiment of the present principles.

FIG. 3 is a cross-sectional side view of a substrate with a hardmask layer, two sacrificial mandrels, and two upright spacers and a photo mask layer on each mandrel, in accordance with an embodiment of the present principles.

In various embodiments, a sidewall image transfer (SIT) technique may be used to form one or more vertical fins 111 on the substrate. In a typical SIT process, upright spacers are formed on the sidewall of a sacrificial mandrel. The sacrificial mandrel is removed and the remaining upright spacers are used to mask the top semiconductor layer, and form one or more vertical fins 111 by etching the substrate 110. The upright spacers are then removed after the semiconductor vertical fins 111 have been formed.

In one or more embodiments, upright spacers 151 may be formed on the sacrificial mandrel(s) 131, where the upright spacers 151 may have a thickness and a pitch that determines the subsequent width and pitch of one or more vertical fin(s).

In various embodiments, the upright spacers 151 may be an oxide, for example, silicon oxide (SiO), a nitride, for example, a silicon nitride (SiN), or an oxynitride, for example, silicon oxynitride (SiON). The upright spacers 151 may be formed by a blanket deposition, and etched back to remove portions of a spacer layer from the surface of the hardmask layer 121 and the masking sections 141.

Figure 4:
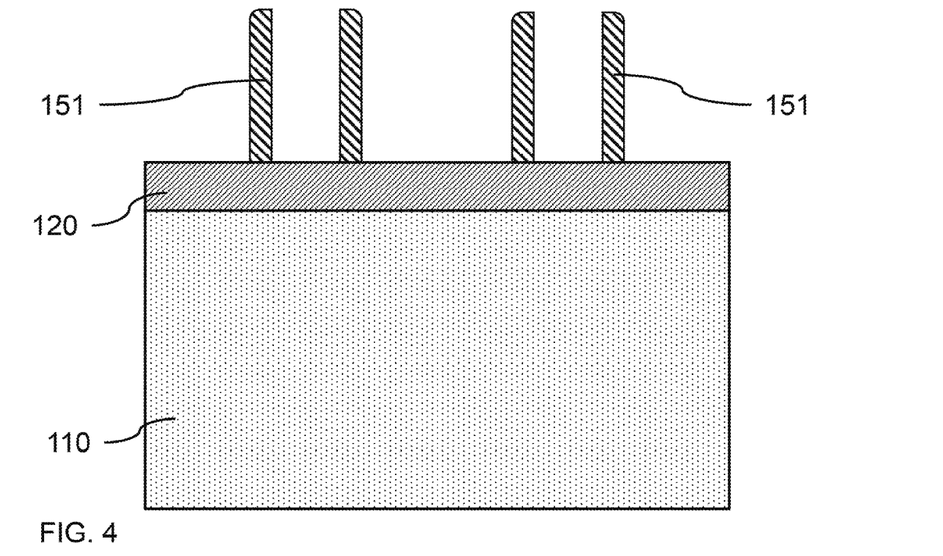
FIG. 4 is a cross-sectional side view of a plurality of upright spacers on a hardmask layer, in accordance with an embodiment of the present principles.

FIG. 4 is a cross-sectional side view of a plurality of upright spacers on a hardmask layer, in accordance with an embodiment of the present principles.

In one or more embodiments, the upright spacers 151 may form a template for patterning the hardmask layer 120, where exposed portions of the hardmask layer 120 may be removed by, for example, RIE, to form one or more hardmask fin template(s) 121 below the upright spacers 151.

In one or more embodiments, the hardmask layer 120 may be etched to form one or more hardmask fin template(s) 121, where the upright spacers 151 defined the width, length, and location of the hardmask fin template(s) 121 on the substrate 110. Removal of portions of the hardmask layer 120 may expose portions of the underlying substrate 110.

In one or more embodiments, the hardmask fin template(s) 121 may have a width, $W_1$, in the range of about 6 nm to about 20 nm, or may have a width in the range of about 8 nm to about 15 nm, or may have a width in the range of about 10 nm to about 12 nm. The hardmask fin template(s) 121 may have a length, $L_1$, in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch, $P_1$, between adjacent hardmask fin template(s) 121 in the range of about 30 nm to about 200 nm, or in the range of about 30 nm to about 100 nm, or in the range of about 30 nm to about 50 nm, or about 42 nm.

Figure 5:
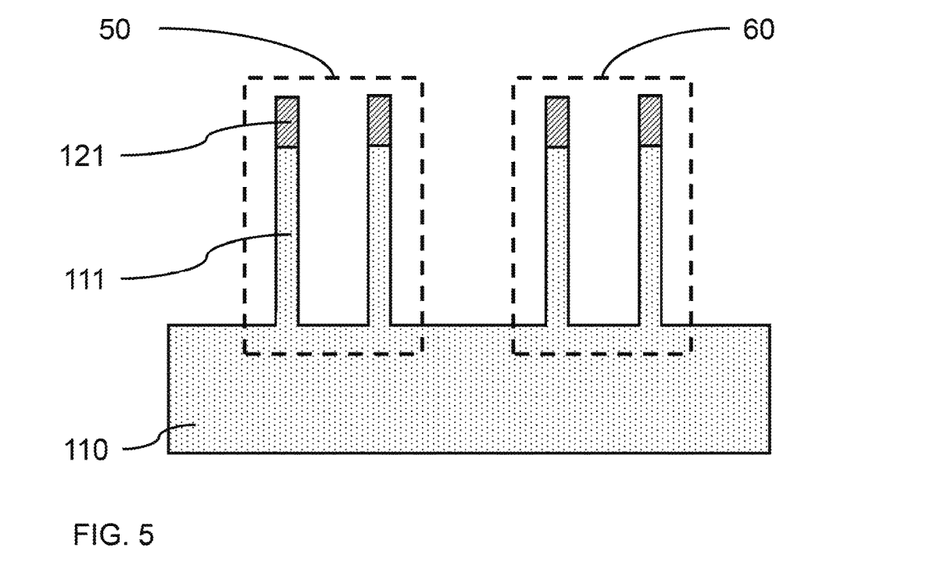
FIG. 5 is a cross-sectional side view of hardmask fin templates on each of a plurality of fins formed from the substrate after removal of the upright spacers, in accordance with an embodiment of the present principles.

FIG. 5 is a cross-sectional side view of hardmask fin templates on each of a plurality of fins formed from the substrate after removal of the upright spacers, in accordance with an embodiment of the present principles.

In one or more embodiments, portions of the substrate 110 exposed between the hardmask fin template(s) 121 may be removed to form one or more vertical fin(s) 111. In various embodiments, the vertical fin(s) 111 may be formed from the crystalline substrate material, where the substrate may be a single crystal Si substrate and the vertical fins may be single crystal silicon.

In various embodiments, the portions of the substrate 110 exposed between the hardmask fin template(s) 121 may be removed by a directional, dry plasma etch (e.g., reactive ion etch (RIE)).

In one or more embodiments, portions of the substrate may be removed to a depth in the range of about 100 nm to about 200 nm, or in the range of about 125 nm to about 175 nm, although other depths are contemplated. Etching to the predetermined depth forms vertical fin(s) with a height in the range of about 100 nm to about 200 nm, or in the range of about 125 nm to about 175 nm, although other heights are contemplated. The vertical fin(s) 111 may form the channel of a finFET, where the current flows from a source to a drain in a direction parallel with the surface of the substrate 110 (e.g., horizontally).

In various embodiments, the vertical fin(s) 111 may have a width in the range of about 6 nm to about 20 nm, or may have a width in the range of about 8 nm to about 15 nm, or in the range of about 10 nm to about 12 nm.

In various embodiments, one or more vertical fin(s) in a first region 50 on the substrate may be predetermined to form an NFET and one or more vertical fin(s) in a second region 60 on the substrate may be predetermined to form a PFET, where an NFET and a PFET may be electrically coupled to form a CMOS. In various embodiments, the first region 50 may have NFET(s) or PFET(s), and the second region 60 adjacent to the first region 50 may have the type of FET not formed in the first regions 50. One of the first region or the second region may include an NFET, and the other of the first region 50 or the second region 60 may include a PFET.

Figure 6:
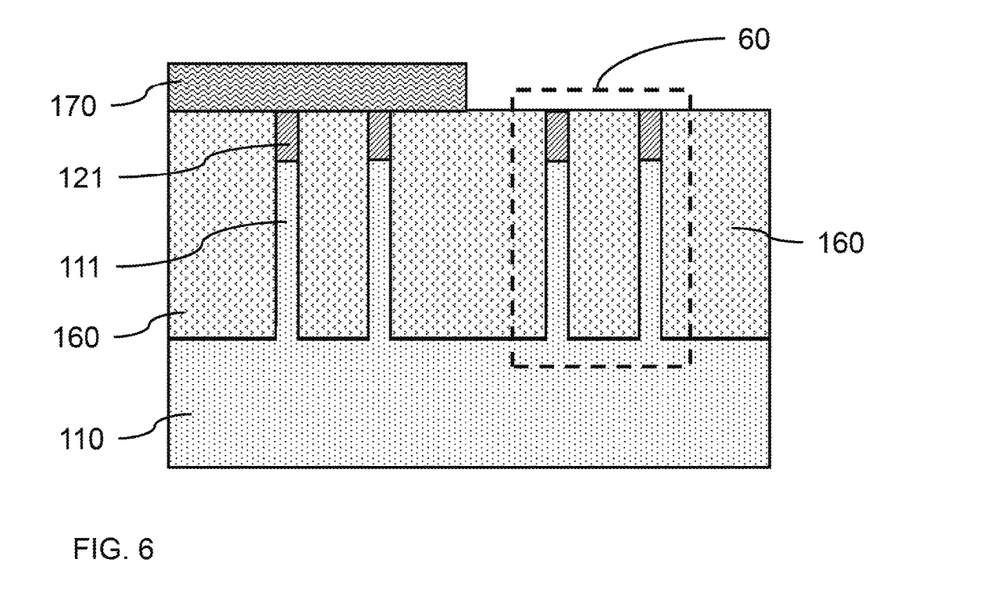
FIG. 6 is a cross-sectional side view of a masked fill layer on the substrate between the fins, in accordance with an embodiment of the present principles.

FIG. 6 is a cross-sectional side view of a masked fill layer on the substrate between the fins, in accordance with an embodiment of the present principles.

In one or more embodiments, a fill layer 160 may be formed on the hardmask fin template(s) 121 and vertical fin(s) 111, where the fill layer 160 may be formed on the substrate surface and fill in the space(s) between/around the vertical fin(s) 111. The fill layer may extend above the height of the top surface of the hardmask fin template(s) 121. A chemical-mechanical polishing (CMP) may be used to reduce the height of the fill layer 160 to the height of the top surface of the hardmask fin template(s) 121 to provide a smooth flat surface.

In one or more embodiments, the fill layer 160 may be amorphous carbon (aC), wherein the amorphous carbon may be deposited by a CVD process.

In various embodiments, a protective layer 170 may be formed on at least a portion of the top surface of the fill layer 160 and hardmask fin template(s) 121, where the protective layer masks a portion of the fill layer 160 and one or more vertical fin(s) 111. The protective layer 170 may be patterned to expose a portion of the fill layer 160 and one or more vertical fin(s) 111, where the exposed portion of the fill layer may be removed to expose a predetermined set of fin(s) for subsequent doping to form an NFET or PFET. The protective layer 170 may be an organic resist material that can be patterned and developed to expose a portion of the fill layer.

Figure 7:
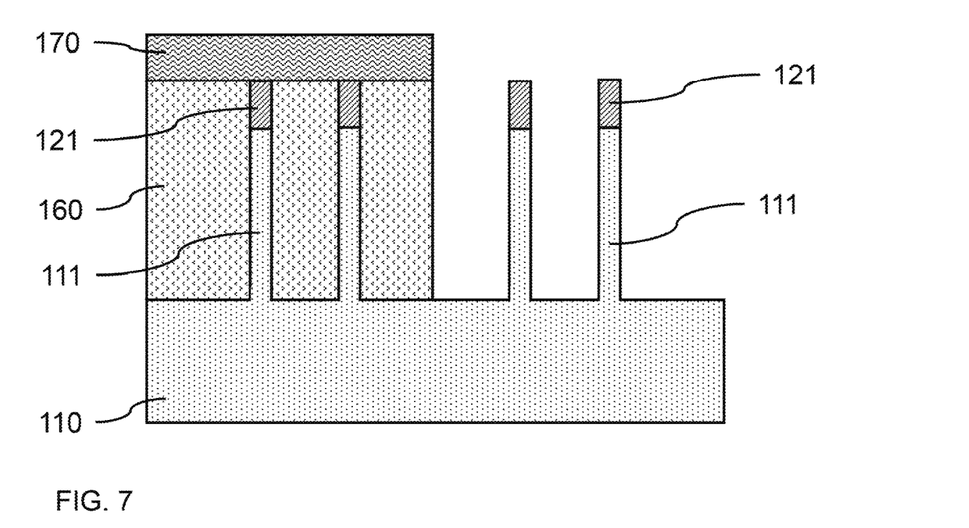
FIG. 7 is a cross-sectional side view of a plurality of a partially removed fill layer exposing a plurality of fins on the substrate, in accordance with an embodiment of the present principles.

FIG. 7 is a cross-sectional side view of a plurality of a partially removed fill layer exposing a plurality of fins on the substrate, in accordance with an embodiment of the present principles.

In one or more embodiments, a portion of the fill layer 160 may be removed, where the portion of the fill layer may be removed by a directional etch, for example, RIE. Removal of the portion of the fill layer 160 may expose one or more hardmask fin template(s) and underlying vertical fin(s) 111.

Figure 8:
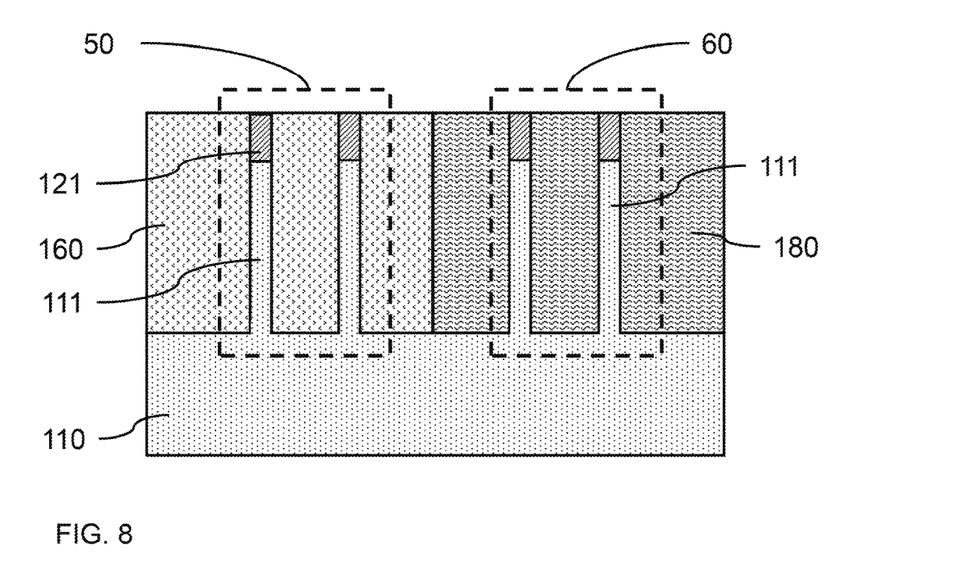
FIG. 8 is a cross-sectional side view of a first dopant source on a plurality of vertical fins on the substrate, in accordance with an embodiment of the present principles.

FIG. 8 is a cross-sectional side view of a first dopant source on a plurality of vertical fins on the substrate, in accordance with an embodiment of the present principles.

In one or more embodiments, a first dopant source 180 may be formed on the exposed hardmask fin template(s) 121 and underlying vertical fin(s) 111, where the first dopant source may be an n-type dopant source or a p-type dopant source. The first dopant source 180 may be formed on the hardmask fin template(s) 121 and underlying vertical fin(s) 111 by a blanket deposition, for example, CVD, where the height of the first dopant source may extend above the top surface of the hardmask fin template(s) 121. A CMP may be used to reduce the height of the first dopant source 180 to provide a smooth, flat surface. In various embodiments, the protective layer 170 on the remaining portion of the fill layer 160 may be removed during the same CMP process used to reduce the height of the first dopant source 180. Removal of the protective layer 170 may expose the remaining portion of the fill layer 160 on one or more hardmask fin template(s) 121 and underlying vertical fin(s) 111. In various embodiments, the exposed vertical fin(s) in second region 60 may be predetermined to form a PFET.

In one or more embodiments, a first dopant source 180 may be an amorphous silicon oxide (a-SiO) (e.g., a glass), where the a-SiO may include a predetermined first dopant species. The amorphous silicon oxide may be formed by a thermal deposition (e.g., CVD), where the dopant may be introduced in-situ during formation (e.g., deposition, growth, etc.) of the first dopant source.

In various embodiments, the dopants species may have a concentration in the first dopant source 180 in the range of about $1\times10^{17}/cm^3$ to about $1\times10^{19}/cm^3$, or about $1\times10^{18}/cm^3$ to about $1\times10^{19}/cm^3$. The first dopant source 180 may be an insulating material, where the dopant is not activated and the concentration is not great enough to make the dopant source material conducting.

In various embodiments, the first dopant species may be arsenic (As) or phosphorus (P), as n-type dopants, or the first dopant species may be boron (B), as a p-type dopant. In various embodiments, aluminum, gallium, indium, and antimony are not used as p-type or n-type dopants.

Figure 9:
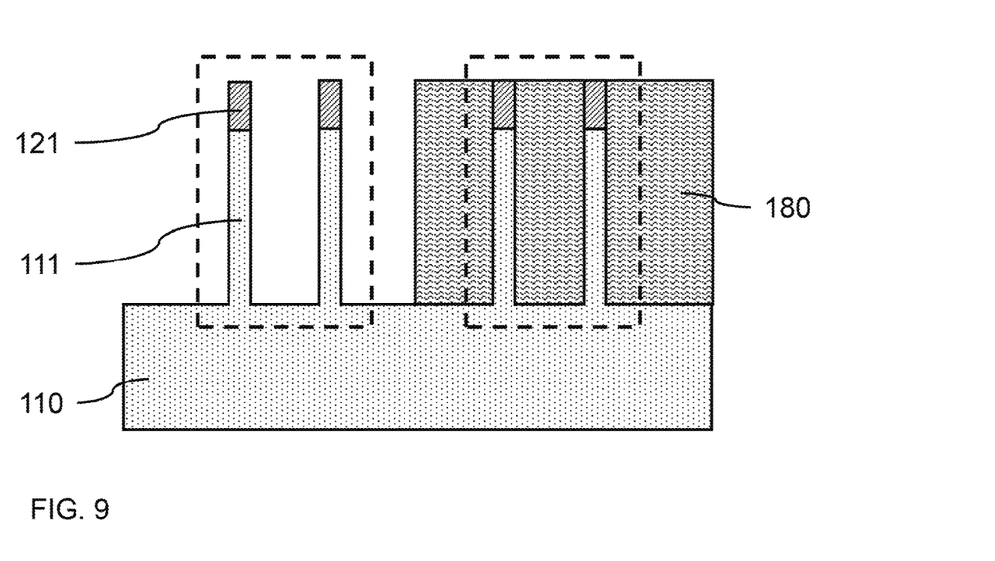
FIG. 9 is a cross-sectional side view of a first dopant source on a plurality of fins after removal of the remaining fill layer, in accordance with an embodiment of the present principles.

FIG. 9 is a cross-sectional side view of a first dopant source on a plurality of fins after removal of the remaining fill layer, in accordance with an embodiment of the present principles.

In one or more embodiments, a portion of the fill layer 160 remaining after removal of the protective layer 170 may be removed. The fill layer 160 may be removed by ashing if the fill layer is amorphous carbon. Removal of the remaining portion of the fill layer 160 may expose one or more vertical fin(s) 111 and hardmask fin template(s) 121 that were covered during formation of the first dopant source 180. In various embodiments, the exposed vertical fin(s) in first region 50 may be predetermined to form an NFET.

Figure 10:
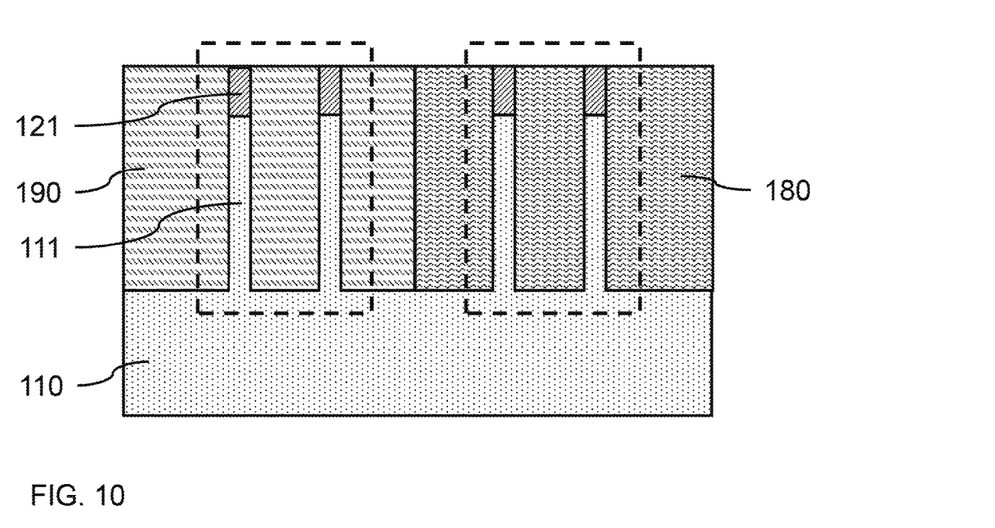
FIG. 10 is a cross-sectional side view of a first dopant source surrounding a plurality of vertical fins and a second dopant source surrounding a plurality of different vertical fins, in accordance with an embodiment of the present principles.

FIG. 10 is a cross-sectional side view of a first dopant source surrounding a plurality of vertical fins and a second dopant source surrounding a plurality of different vertical fins, in accordance with an embodiment of the present principles.

In one or more embodiments, a second dopant source 190 may be formed on the exposed hardmask fin template(s) 121 and underlying vertical fin(s) 111, where the second dopant source 190 may be an n-type dopant source or a p-type dopant source. The dopant for the second dopant source 190 may be the opposite type of dopant from the first dopant source 180. The second dopant source 190 may be formed on the hardmask fin template(s) 121 and underlying vertical fin(s) 111 by a blanket deposition, for example, CVD, where the height of the second dopant source 190 may extend above the top surface of the hardmask fin template(s) 121. A CMP may be used to reduce the height of the second dopant source 190 to provide a smooth, flat surface.

In one or more embodiments, a protective layer may be formed on the first dopant source 180 before formation of the second dopant source 190. In various embodiments, the protective layer on the first dopant source 180 may be removed during the same CMP process used to reduce the height of the second dopant source 190. Removal of the protective layer may expose the first dopant source 180 on one or more hardmask fin template(s) 121 and underlying vertical fin(s) 111.

In one or more embodiments, a second dopant source 190 may be an amorphous silicon oxide (a-SiO) (e.g., a glass), where the a-SiO may include a predetermined second dopant species. The amorphous silicon oxide may be formed by a thermal deposition (e.g., CVD), where the dopant may be introduced in-situ during formation (e.g., deposition, growth, etc.) of the second dopant source.

In various embodiments, the dopant species may have a concentration in the second dopant source 190 in the range of about $1 \times 10^{17}/cm^3$ to about $1 \times 10^{19}/cm^3$, or about $1 \times 10^{18}/cm^3$ to about $1 \times 10^{19}/cm^3$. The second dopant source 190 may be an insulating material, where the dopant is not activated and the concentration is not great enough to make the material conducting.

In various embodiments, the second dopant species may be arsenic (As) or phosphorus (P), as n-type dopants, or the second dopant species may be boron (B), as a p-type dopant. In various embodiments, the second dopant species is different from the first dopant species, such that either the first dopant source or second dopant source can dope a channel to form an n-type FET, and the dopant for the other dopant source can dope a channel to form a p-type FET. In various embodiments, aluminum, gallium, indium, and antimony are not used as p-type or n-type dopants.

In a non-limiting exemplary embodiment, the material of the first dopant source 180 may be a borosilicate glass (BSG), where the boron is a p-type dopant species having a concentration in the range of about $1 \times 10^{17}/cm^3$ to about $1 \times 10^{19}/cm^3$, and the material of the second dopant source 190 may be a phosphosilicate glass (PSG), where the phosphorous is an n-type dopant species having a concentration in the range of about $1 \times 10^{17}/cm^3$ to about $1 \times 10^{19}/cm^3$. In various embodiments, the PSG and/or BSG may be conformally formed by low pressure CVD (LPCVD).

Figure 11:
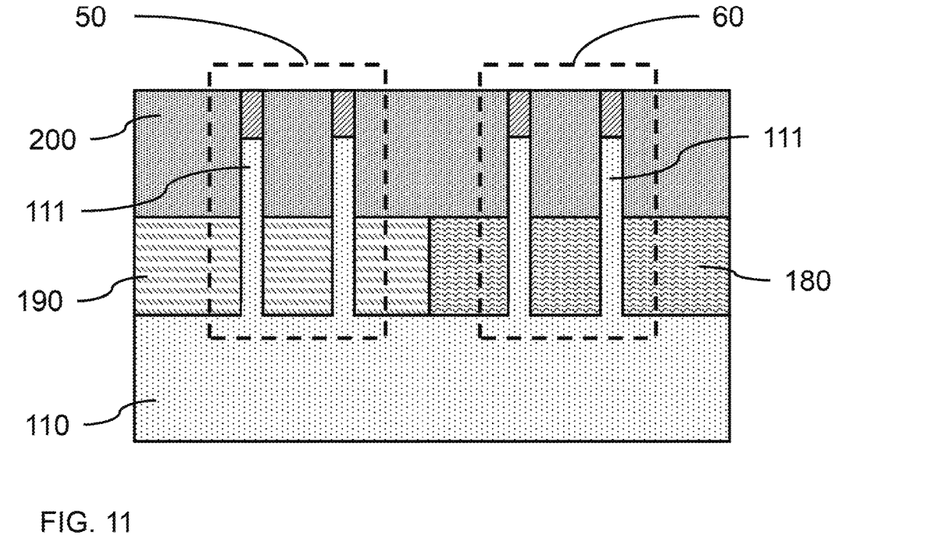
FIG. 11 is a cross-sectional side view of a capping layer on the first dopant source and second dopant source, in accordance with an embodiment of the present principles.

FIG. 11 is a cross-sectional side view of a capping layer on the first dopant source and second dopant source, in accordance with an embodiment of the present principles.

In one or more embodiments, a portion of the first dopant source 180 and second dopant source 190 may be removed to reduce the height of the first dopant source and second dopant source. The portion of the first dopant source 180 and second dopant source 190 may be removed by a directional plasma etch that may be selective towards the amorphous SiO. The height of the first dopant source 180 and second dopant source 190 may be reduced, such that the top surface of the first dopant source 180 and second dopant source 190 may be below half the height of the vertical fins 111. In various embodiments, the thickness of the first dopant source 180 and second dopant source 190 may be in the range of about 50 nm to about 150 nm, or in the range of about 75 nm to about 125 nm, although other heights are contemplated and the thickness may depend on the height of the adjacent vertical fin(s) 111.

In one or more embodiments, a capping layer 200 may be formed on the top surfaces of the first dopant source 180 and the second dopant source 190. The capping layer 200 may be formed on the hardmask fin template(s) 121 and underlying vertical fin(s) 111 by a blanket deposition, for example, CVD, where the height of the capping layer 200 may extend above the top surface of the hardmask fin template(s) 121. A CMP may be used to reduce the height of the capping layer 200 to provide a smooth, flat surface.

In one or more embodiments, the capping layer 200 may be an amorphous silicon oxide (a-SiO) (e.g., a glass), where the a-SiO may not include any dopant species. The capping layer 200 may be an insulating material, for example, $SiO_2$.

Figure 12:
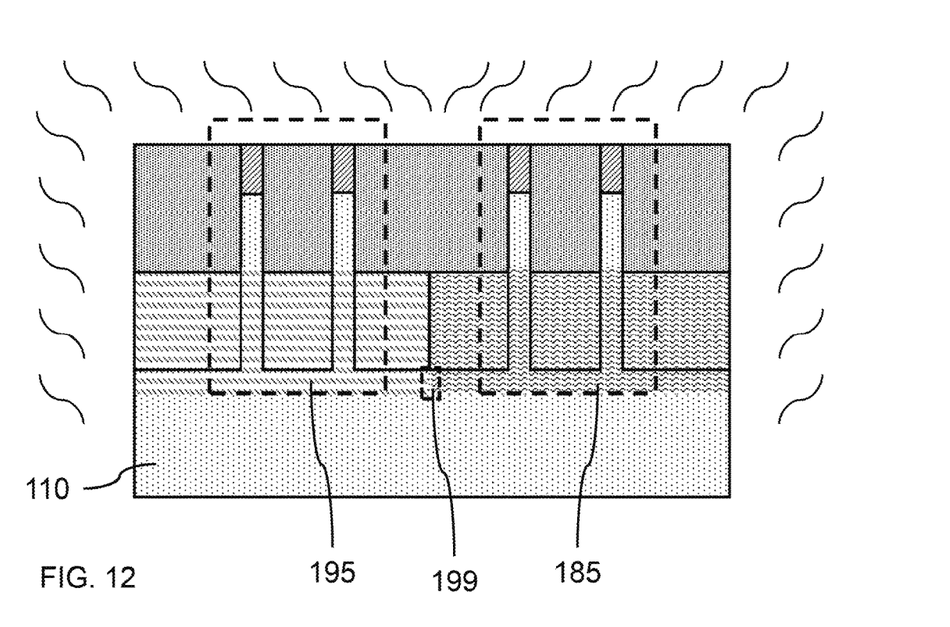
FIG. 12 is a cross-sectional side view of a first dopant source and a second dopant source on a plurality of fins being heat treated, in accordance with an embodiment of the present principles.

FIG. 12 is a cross-sectional side view of a first dopant source and a second dopant source on a plurality of fins being heat treated, in accordance with an embodiment of the present principles.

In one or more embodiments, the substrate 110, vertical fins 111, hardmask fin templates 121, first dopant source 180, second dopant source 190, and capping layer 200 may be heat treated, where the heat treatment may provide for the dopant species in the first dopant source 180 and second dopant source 190 to diffuse into at least a portion of the one or more vertical fin(s) 111 in contact with the first dopant source or second dopant source, and at least a portion of the substrate 110 in contact with the first dopant source or second dopant source, where diffusion may be into both sides of a vertical fin.

In one or more embodiments, the heat treatment may be conducted at a temperature in the range of about 800° C. to about 1000° C., or in the range of about 800° C. to about 850° C. In various embodiments, the heat treatment may be conducted for a period of time in the range of about 30 seconds to about 150 minutes, or in the range of about 30 minutes to about 120 minutes, or in the range of about 60 minutes to about 120 minutes, although other durations are contemplated. In various embodiments, the combination of heat treatment temperature and duration is sufficient to allow the dopant species to diffuse from the first dopant source 180 and/or second dopant source 190 a predetermined distance into the substrate 110. In various embodiments, the combination of heat treatment temperature and duration is sufficient to allow the dopant species to achieve an equilibrium concentration in each of the vertical fin(s) 111 in contact with a dopant source.

In various embodiments, the heat treatment may be a thermal anneal, where the heat treatment may be conducted in a furnace. In various embodiments, the heat treatment is not conducted by a rapid thermal anneal or a laser anneal.

In one or more embodiments, the heat treatment may densify the amorphous silicon oxide of the first dopant source 180, second dopant source 190, and capping layer 200.

In one or more embodiments, a first doped region 185 may be formed in the substrate 110 below the first dopant source 180. The first doped region 185 may be a punch-through stop/well below the vertical fin(s) 111. The first doped region 185 may be formed in the substrate above which each of the one or more vertical fins are formed. The dopant may be provided to the first doped region 185 by diffusion during the heat treatment. In various embodiments, the first doped region 185 may be n-doped or p-doped depending on the type of finFET being fabricated. In various embodiments, the punch-through stops/wells may extend a distance in the range of about 10 nm to about 30 nm, or in the range of about 15 nm to about 20 nm, into the substrate from the interface with the first dopant source 180.

In one or more embodiments, a second doped region 195 may be formed in the substrate 110 below the second dopant source 190. The second doped region 195 may be a punch-through stop/well below the vertical fin(s) 111. The second doped region 195 may be formed in the substrate above which each of the one or more vertical fins are formed. The dopant may be provided to the second doped region 195 by diffusion during the heat treatment. In various embodiments, the second doped region 195 may be n-doped or p-doped depending on the type of finFET being fabricated. In various embodiments, the punch-through stop/well may extend a distance in the range of about 10 nm to about 30 nm, or in the range of about 15 nm to about 20 nm, into the substrate from the interface with the second dopant source 190.

In various embodiments, the first doped region 185 and second doped region 195 may overlap due to lateral diffusion to form a compensated interface 199, where the n-type dopants and p-type dopants counteract each other to reduce or eliminate the carrier concentration at the interface 199.

In various embodiments, the dopant type of the first doped region 185 is opposite the dopant type of the source/drains formed for the type of finFET being fabricated, where formation of a punch-through stop/well of the opposite doping type may reduce or prevent current leakage through the substrate 110. In a non-limiting exemplary embodiment, the first doped region 185 has the opposite polarity (dopant type) as the dopant in the source/drains, where a finFET with n-doped source/drains would have a first doped region 185 that is p-doped (e.g., with boron).

In various embodiments, the dopant type of the second doped region 195 is opposite the dopant type of the source/drains formed for the type of finFET being fabricated, where formation of a punch-through stop/well of the opposite doping type may reduce or prevent current leakage through the substrate 110. In a non-limiting exemplary embodiment, the second doped region 195 has the opposite polarity as the dopant in the source/drains, where a finFET with p-doped source/drains would have a second doped region 195 that is n-doped (e.g., with phosphorous).

Figure 13:
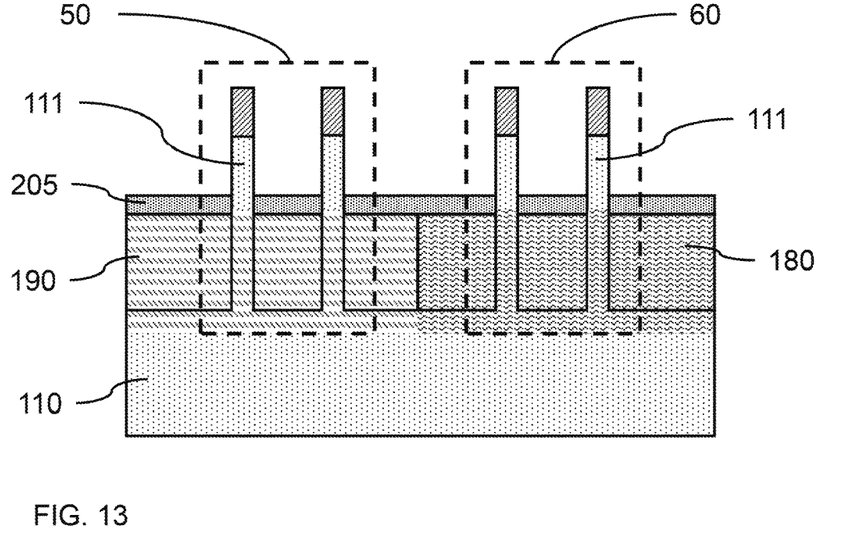
FIG. 13 is a cross-sectional side view of a capping layer with a reduced height on the first dopant source and second dopant source, in accordance with an embodiment of the present principles.

FIG. 13 is a cross-sectional side view of a capping layer with a reduced height on the first dopant source and second dopant source, in accordance with an embodiment of the present principles.

In one or more embodiments, a portion of the capping layer 200 may be removed to reduce the height of the capping layer to expose a portion of the vertical fins 111 and form an isolation spacer 205 on the first dopant source 180 and/or second dopant source 190. The portion of the capping layer 200 may be removed to reduce the height using a directional plasma etch (e.g., RIE). The height of the capping layer 200 may be reduced sufficiently to expose an upper portion of a vertical fin 111, and form an isolation spacer 205 of an isolation region (e.g., shallow trench isolation region), where the isolation spacer 205 may have a thickness in the range of about 5 nm to about 10 nm.

Figure 14:
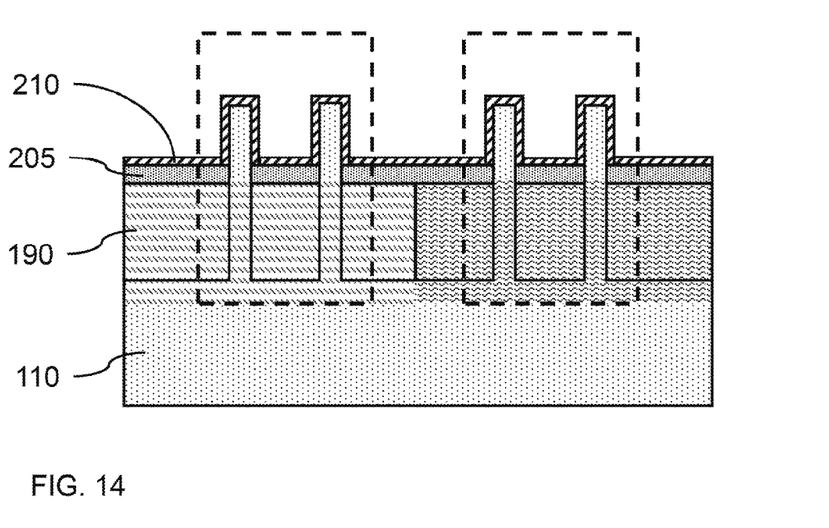
FIG. 14 is a view of a gate dielectric layer on the fins and capping layer, in accordance with an embodiment of the present principles.

FIG. 14 is a cross-sectional side view of a gate dielectric layer on the fins and capping layer, in accordance with an embodiment of the present principles.

In one or more embodiments, the hardmask fin template(s) 121 may be removed to expose the top surface of the one or more vertical fin(s) 111. The hardmask fin template(s) 121 may be removed using a wet etch selective for the material of the hardmask fin template(s) over the material of the isolation spacer 205 and vertical fin(s) 111 or a selective RIE.

In one or more embodiments, a gate dielectric layer 210 may be formed on at least a portion of the vertical fin(s) 111. The gate dielectric layer 210 formed on at least opposite sidewalls of the same vertical fin 111 may form part of a gate structure of a finFET, where the gate dielectric layer 210 may wrap around the sidewalls and top surface.

In one or more embodiments, a gate structure may be formed on the vertical fins 111 by depositing a gate dielectric layer 210 on at least a portion of the exposed vertical fin(s) 111, where the gate dielectric layer 210 may also be formed on at least a portion of the isolation spacer 205, where the isolation spacer and dopant sources 180, 190 may form a bottom spacer below a gate structure.

In various embodiments, the gate dielectric layer 210 may be conformally deposited, for example, by CVD, ALD, or a combination thereof. Undesired portions of the gate dielectric layer 210 may be removed from at least a portion of the isolation spacer 205 to form at least a portion of the gate structure on the vertical fin(s) 111. Portions of gate dielectric layer 210 formed on the isolation spacer 205 may be removed by a directional etch, for example, RIE, where portions of the gate dielectric layer 210 (e.g., top surface) intended to remain as part of the gate structure may be masked prior to the RIE.

In various embodiments, the gate dielectric layer 210 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-K material may further include dopants such as lanthanum and/or aluminum. The stoichiometry of the high-K compounds may vary.

In one or more embodiments, a work function layer 215 may be deposited over the gate dielectric layer 150. The work function layer 215 may form part of a gate structure, where the gate structure may be on a vertical fin 111. In various embodiments, a work function layer 215 may be formed on the gate dielectric layer 210 between the gate dielectric layer 210 and the gate electrode layer 220, 221. The work function layer 215 may include one or more work function material layers to obtain a suitable work function layer for an NFET or a PFET.

In various embodiments, portions of the gate dielectric layer 210 on the isolation spacer 205 and vertical fin(s) 111 may be masked and patterned, as would be known in the art, so different work function layers 215 may be formed on different vertical fin(s) 111 forming an NFET or a PFET.

In various embodiments, the work function layer 215 may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof.

In various embodiments, the work function layer 215 may have a thickness in the range of about 3 nm to about 11 nm, or may have a thickness in the range of about 5 nm to about 8 nm.

Figure 15:
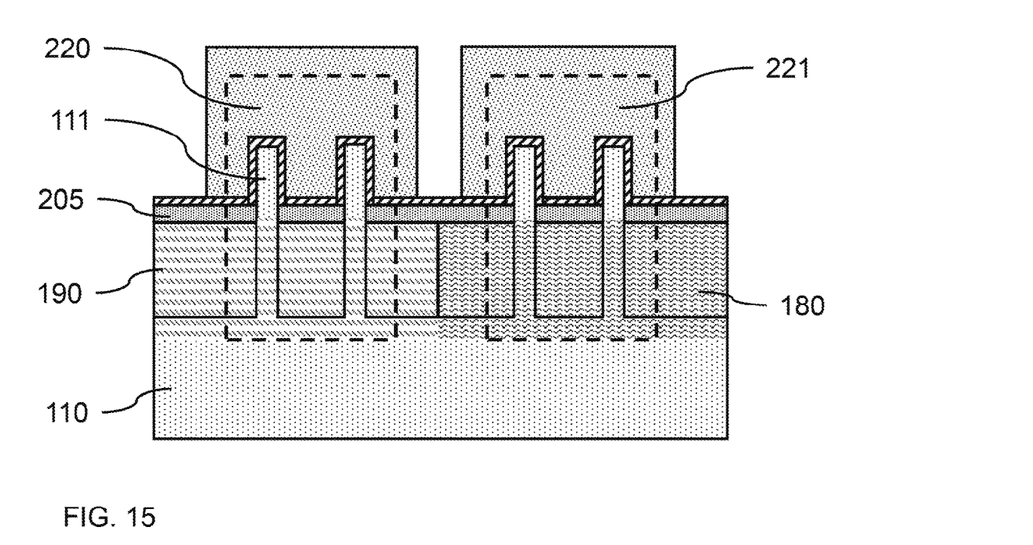
FIG. 15 is a cross-sectional side view of a gate electrode layer formed on the gate dielectric layer for an NFET and a PFET, in accordance with an embodiment of the present principles.

FIG. 15 is a cross-sectional side view of a gate electrode layer formed on the gate dielectric layer for an NFET and a PFET, in accordance with an embodiment of the present principles.

In one or more embodiments, a first gate electrode layer 220 and a second gate electrode layer 221 may be formed on at least a portion of the gate dielectric layer 210, where the gate electrode layer(s) 220, 221 may be a conductive material that forms part of a gate structure on a vertical fin 111. In various embodiments, the gate electrode layer 220, 221 may be formed on the gate dielectric layer 210 and/or work function layer 215. The gate electrode layer 220, 221 may be formed by a blanket deposition that fills the spaces between the vertical fins 111, for example, by ALD, CVD, PVD, or a combination thereof. Portions of gate electrode layer 220, 221 may be removed by RIE to separate the layer into individual gate electrodes, and/or undergo chemical-mechanical polishing (CMP) to provide a smooth, flat surface.

In various embodiments, the conductive gate electrode layer 220 may be tungsten (W). In various embodiments, the conductive gate electrode layer 160 is not molybdenum (Mo), cobalt (Co), copper (Cu), aluminum (Al), or combinations thereof.

In a non-limiting exemplary embodiment, an NFET may have a TiN work function layer 215 and a tungsten (W) gate electrode layer 220, and the PFET may have a stacked TiC/TiN multi-layer work function layer 215 and a tungsten gate electrode layer 221.

In one or more embodiments, a first gate electrode layer 220 may be formed on one or more vertical fin(s) 111 covered by a gate dielectric layer 210 intended to be an NFET, and a second gate electrode layer 221 may be formed on one or more vertical fin(s) 111 intended to be a PFET. The gate electrode layers 220, 221 may be the same metal, where the gate electrode layer may be tungsten.

In one or more embodiments, one or more source/drain(s) may be formed on the vertical fin(s) 111, where the source/drain(s) may be formed by epitaxially growing a source/drain on an exposed portion of a crystalline vertical fin. The source/drain(s) may be doped in-situ (i.e., during growth) or ex-situ (i.e., after growth), where the source/drain may be highly doped (i.e., having a dopant concentration in the range of about $1 \times 10^{20}/cm^3$ to about $1 \times 10^{21}/cm^3$) with phosphorous (P) to form an NFET or boron (B) to form a PFET. The vertical fin(s) 111 and source/drain(s) may be suitably doped to form an NFET or a PFET. In various embodiments, the vertical fin(s) 111 may be suitably doped to form channels for a finFET.

Figure 16:
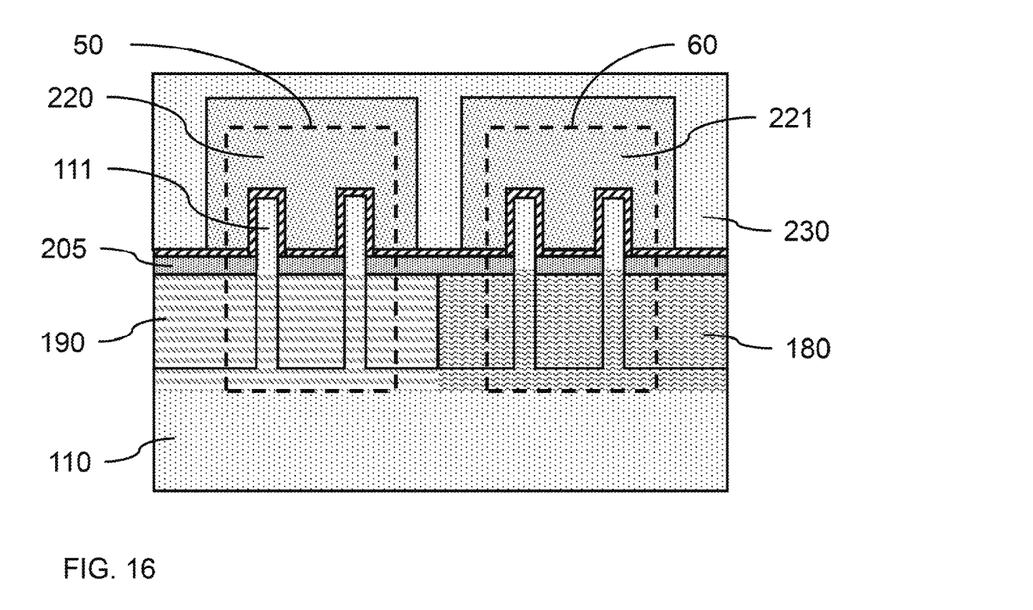
FIG. 16 is a cross-sectional side view of an interlayer dielectric fill on the gate electrode layers, in accordance with an embodiment of the present principles.

FIG. 16 is a cross-sectional side view of an interlayer dielectric fill on the gate electrode layers, in accordance with an embodiment of the present principles.

In one or more embodiments, an interlayer dielectric 230 may be formed on the first gate electrode layer 220 and the second gate electrode layer 221, where the interlayer dielectric may be an insulating material that electrically isolates the first gate electrode layer 220 from the second gate electrode layer 221.

In various embodiments, the interlayer dielectric layer 230 may be silicon oxide (SiO), a low-k dielectric material, including but not limited to, fluorine doped SiO, carbon doped SiO, porous SiO, etc., or combinations thereof.

In various embodiments, interconnect vias may be formed and filled with a conductive material to form source, drain, and gate contacts.

Figure 17:
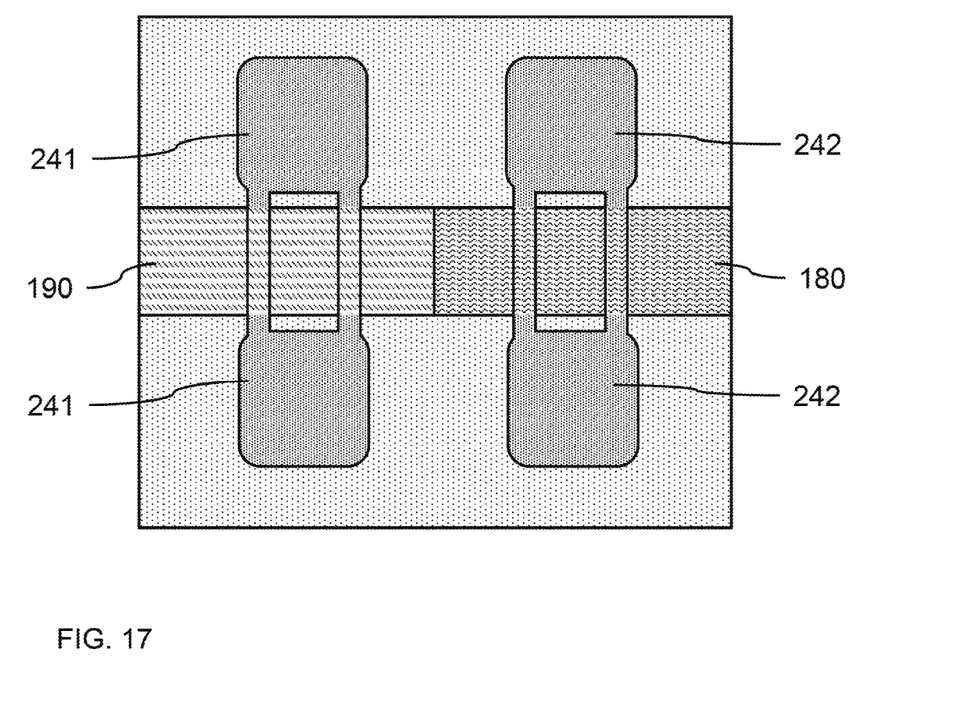
FIG. 17 is a cross-sectional top view of vertical fins with source/drains and dopant sources form isolation regions, in accordance with an embodiment of the present principles.

FIG. 17 is a cross-sectional top view of vertical fins with a common gate electrode, in accordance with an embodiment of the present principles.

In one or more embodiments, a first dopant source 180 may extend along a portion of the length of the vertical fin forming a channel, such that the first dopant source 180 can dope the finFET channel. A second dopant source 190 may extend along a portion of the length of the vertical fin forming a channel, such that the second dopant source 180 can dope the finFET channel. In various embodiments, a first dopant source 180 may extend about 10 nm to about 30 nm along the length of the fin, and a second dopant source 190 may extend about 10 nm to about 30 nm along the length of the fin, which may define the length of the channel.

In one or more embodiment, a source/drains 241, 242 may be formed on one or more vertical fins 111. The source/drain 241, 242 may be doped in-situ or ex-situ, where the doping may be an n-type dopant or a p-type dopant to form an n-type finFET (NFET) or a p-type finFET (PFET) in conjunction with the doped channel formed by the vertical fin. The doping type of the first or second doped regions may also be determined by whether an NFET or PFET is being fabricated. The current may flow across the vertical fin in the plane of the substrate (i.e., horizontally) from a source to a drain. The source and drain may be interchanged.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a method of device fabrication and a CMOS device thereby fabricated (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A complementary metal oxide semiconductor (CMOS) device with punch-through stops/wells, comprising:
one or more vertical fin(s) on a substrate in a first region and one or more vertical fin(s) on the substrate in a second region, wherein the first region is adjacent to the second region;
a first dopant source on the one or more vertical fin(s) in the first region, wherein the first dopant source extends along a portion of the length of each of the one or more vertical fins in the first region;
a second dopant source on the one or more vertical fin(s) in the second region, wherein the second dopant source extends along a portion of the length of each of the one or more vertical fins in the second region;
a first doped region in the substrate forming a first punch-through stop/well below the first dopant source, wherein the first punch-through stop/well includes a first dopant at a concentration in the range of about $1 \times 10^{17}/cm^3$ to about $1 \times 10^{19}/cm^3$;
a second doped region in the substrate forming a second punch-through stop/well below the second dopant source, wherein the second punch-through stop/well includes a second dopant at a concentration in the range of about $1 \times 10^{17}/cm^3$ to about $1 \times 10^{19}/cm^3$;
an isolation spacer on the first dopant source and the second dopant source, wherein the thickness of the first dopant source and second dopant source are in the range of about 50 nm to about 150 nm; and
a gate dielectric layer on at least a portion of the isolation spacer, at least a portion of the one or more vertical fins) in the first region, and at least a portion of the one or more vertical fin(s) in the second region.

2. The CMOS device of claim 1, wherein the first punch-through stop/well is doped with boron, and the second punch-through stop/well is doped with phosphorous.

3. The CMOS device of claim 1, further comprising a gate electrode layer on the one or more vertical fin(s) in the first region, and a gate electrode layer on the one or more vertical fin(s) in the second region.

4. The CMOS device of claim 1, wherein the first dopant source and the second dopant source are insulating glasses that form an isolation region between the one or more fin(s) in the second region and the one or more vertical fin(s) in the first region.

5. The CMOS device of claim 1, where the isolation spacer has a thickness in the range of about 5 nm to about 10 nm.

6. The CMOS device of claim 1, wherein the first punch-through stop/well extends a distance into the substrate in the range of about 10 nm to about 30 nm, and the second punch-through stop/well extends into the substrate a distance in the range of about 10 nm to about 30 nm.

7. The CMOS device of claim 1, wherein the first dopant and the second dopant are not aluminum, gallium, indium, or antimony.

8. The CMOS device of claim 1, wherein one of the first dopant or the second dopant is an n-type dopant, and the other of the first dopant or the second dopant is a p-type dopant.

9. The CMOS device of claim 1, wherein the first dopant is boron and the second dopant is phosphorous.

10. The CMOS device of claim 1, wherein the first doped region in the substrate at least partially overlaps the second doped region in the substrate to form a compensated interface.

11. The CMOS device of claim 10, wherein the material of the second dopant source is phospho-silicate glass (PSG)

or boro-silicate glass (BSG), and wherein the material of the second dopant source is different from the material of the first dopant source.

12. The CMOS device of claim 1, wherein the one or more vertical fin(s) in the first region are doped to form an n-type field effect transistor and the one or more vertical fin(s) in the second region are doped to form a p-type field effect transistor.

13. A complementary metal oxide semiconductor (CMOS) device with punch-through stops/wells, comprising:
- one or more vertical fin(s) on a substrate in a first region and one or more vertical fin(s) on the substrate in a second region, where the first region is adjacent to the second region, and the one or more vertical fin(s) in the first region are doped to form an n-type field effect transistor and the one or more vertical fin(s) in the second region are doped to form a p-type field effect transistor;
- a first dopant source on the one or more vertical fin(s) in the first region, wherein the first dopant source extends along a portion of the length of each of the one or more vertical fins in the first region;
- a second dopant source on the one or more vertical fin(s) in the second region, wherein the second dopant source extends along a portion of the length of each of the one or more vertical fins in the second region;
- a first doped region in the substrate forming a first punch-through stop/well below the first dopant source, wherein the first punch-through stop/well includes a first dopant at a concentration in the range of about $1\times10^{17}/cm^3$ to about $1\times10^{19}/cm^3$;
- a second doped region in the substrate forming a second punch-through stop/well below the second dopant source;
- an isolation spacer on the first dopant source and the second dopant source, wherein the thickness of the first dopant source and second dopant source are in the range of about 50 nm to about 150 nm; and
- a gate dielectric layer on at least a portion of the isolation spacer, at least a portion of the one or more vertical fin(s) in the first region, and at least a portion of the one or more vertical fin(s) in the second region.

14. The CMOS device of claim 13, wherein the material of the second dopant source is phospho-silicate glass (PSG) or boro-silicate glass (BSG), and wherein the material of the second dopant source is different from the material of the first dopant source.

15. The CMOS device of claim 13, wherein the vertical fins have a width in the range of about 6 nm to about 20 nm.

16. A complementary metal oxide semiconductor (CMOS) device with punch-through stops/wells, comprising:
- one or more vertical fin(s) on a substrate in a first region and one or more vertical fin(s) on the substrate in a second region, where the first region is adjacent to the second region, and the one or more vertical fin(s) in the first region are doped to form an n-type field effect transistor and the one or more vertical fin(s) in the second region are doped to form a p-type field effect transistor;
- a first dopant source on the one or more vertical fin(s) in the first region, wherein the first dopant source is borosilicate glass (BSG), where the boron is at a concentration in the range of about $1\times10^{17}/cm^3$ to about $1\times10^{19}/cm^3$;
- a second dopant source on the one or more vertical fin(s) in the second region, wherein the second dopant source is phosphosilicate glass (PSG), where the phosphorous is at a concentration in the range of about $1\times10^{17}/cm^3$ to about $1\times10^{19}/cm^3$;
- a first doped region in the substrate forming a first punch-through stop/well below the first dopant source;
- a second doped region in the substrate forming a second punch-through stop/well below the second dopant source, wherein the second punch-through stop/well includes a second dopant at a concentration in the range of about $1\times10^{17}/cm^3$ to about $1\times10^{19}/cm^3$;
- an isolation spacer on the first dopant source and the second dopant source, wherein the thickness of the first dopant source and second dopant source are in the range of about 50 nm to about 150 nm; and
- a gate dielectric layer on at least a portion of the isolation spacer, at least a portion of the one or more vertical fin(s) in the first region, and at least a portion of the one or more vertical fin(s) in the second region.

* * * * *